United States Patent [19]
Laity et al.

[11] Patent Number: 6,095,851
[45] Date of Patent: Aug. 1, 2000

[54] STATUS INDICATOR FOR ELECTRONIC DEVICE

[75] Inventors: Ian A. Laity, Simi Valley; Joakim Ahlstrom, Pasadena, both of Calif.

[73] Assignee: Xircom, Inc., Thousand Oaks, Calif.

[21] Appl. No.: 09/290,629

[22] Filed: Apr. 12, 1999

Related U.S. Application Data

[63] Continuation-in-part of application No. 08/971,501, Nov. 17, 1997, Pat. No. 5,984,731, and a continuation-in-part of application No. 09/048,143, Mar. 25, 1998.
[60] Provisional application No. 60/101,678, Sep. 24, 1998.

[51] Int. Cl.[7] .................................................. H01R 3/00
[52] U.S. Cl. ......................... 439/490; 439/676; 439/910
[58] Field of Search ................................... 439/490, 676, 439/910, 76.1

[56] References Cited

U.S. PATENT DOCUMENTS

| | | | |
|---|---|---|---|
| 4,271,455 | 6/1981 | McComas | 361/331 |
| 4,379,606 | 4/1983 | Clark et al. | 339/17 |
| 4,457,570 | 7/1984 | Bogese, II | 339/17 |
| 4,978,317 | 12/1990 | Pocrass | 439/490 |
| 5,222,164 | 6/1993 | Bass, Sr. et al. | 439/490 |
| 5,268,823 | 12/1993 | Yergenson | 362/32 |
| 5,327,328 | 7/1994 | Simms et al. | 362/26 |
| 5,345,367 | 9/1994 | Pierce et al. | 362/32 |
| 5,727,862 | 3/1998 | Wu | 362/27 |
| 5,755,822 | 5/1998 | Scheffner | 439/490 |
| 5,773,332 | 6/1998 | Glad | 439/344 |
| 5,775,946 | 7/1998 | Briones | 439/607 |
| 5,790,041 | 8/1998 | Lee | 439/490 |
| 5,876,239 | 3/1999 | Morin et al. | 439/490 |
| 5,885,100 | 3/1999 | Talend et al. | 439/490 |

FOREIGN PATENT DOCUMENTS

| | | |
|---|---|---|
| 0740370A1 | 10/1996 | European Pat. Off. . |
| 0862245A1 | 9/1998 | European Pat. Off. . |
| 0895318A2 | 2/1999 | European Pat. Off. . |
| WO9846934 | 10/1998 | WIPO . |

OTHER PUBLICATIONS

PCT International Search Report mailed Jan. 12, 2000 re International Application No. PCT/US/99/08354, international filing date Apr. 16, 1999.
Advertisement, *PC Magazine*, Jun. 8, 1998.
Article, "Road Worrier No More," *PC Magazine*, Jul. 1998, p. 73.

*Primary Examiner*—Paula Bradley
*Assistant Examiner*—Tho Dac Ta
*Attorney, Agent, or Firm*—Hogan & Hartson LLP

[57] ABSTRACT

An electronic device adapted to be coupled to an information transfer system by means of a conductor including a standard connector having a translucent or transparent body insertable into a receptacle defined by the electronic device, the device including a housing, a substrate carrying electronic components, a light source mounted on the substrate and connected to components on the substrate, the light source being energizable in response to electrical signals generated by said components, the signals being indicative of the status and/or activity of the device, and a light guide extending between the light source and the receptacle for transmitting light from the light source to the receptacle, the light transmitted from the source to the receptacle illuminating the connector body thereby providing an indication of the status and/or activity of the electronic device.

23 Claims, 5 Drawing Sheets

STATUS INDICATOR FOR ELECTRONIC DEVICE

CROSS REFERENCE TO RELATED APPLICATIONS

This application claims the benefit of U.S. Provisional application No. 60/101,678 filed Sep. 24, 1998. This application is also a continuation-in-part of application Ser. No. 08/971,501 filed Nov. 17, 1997, U.S. Pat. No. 5,984,731 and a continuation-in-part of application Ser. No. 09/048,143 filed Mar. 25, 1998, both of which applications are incorporated herein by reference.

BACKGROUND OF THE INVENTION

1. Area of the Art

The present invention relates to indicators for displaying the status and/or activity of an electronic device such as a communications PC card providing phone line and/or LAN connections.

2. Description of the Prior Art

PC cards are devices inserted into slots in host electronic systems. Such cards conform to various physical and electrical standards according to the type of slot in the host system. One such communications card conforming to the Type III PCMCIA PC card standard is disclosed in U.S. Pat. No. 5,773,332 issued Jun. 30, 1998. See, in particular, FIG. 21 and column 15, line 53 through column 16, line 11 of the '332 patent, which patent is incorporated herein by reference. The communications card of the '332 patent is sold by Xircom, Inc., Thousand Oaks, Calif., under the trademark "RealPort."

PCMCIA cards used as communication links generally comprise a housing, a substrate or printed circuit board within the housing, a 68-pin connector at the front end of the housing for connecting the card to the host system and at least one receptacle at the rear end of the card for connecting the card to an information transfer system such as a phone line or LAN. A representation of such a prior art card 10 is shown in attached FIG. 1. In accordance with the prior art, mounted on the substrate or PCB are a plurality of status or activity light emitting diodes (LEDs)(for example, four in number) having different colors. A light pipe is associated with each LED and extends from one end of the light pipe adjacent to the LED to another, outer end 12 of the light pipe disposed in a longitudinal slot 14 along the top exterior surface of the card adjacent to the rear end thereof. The LEDs indicate the status and/or activity of the card 10 and when illuminated, the light from these LEDs is visible to the user via the associated light pipes. The light pipe indicators 12 may be used to show Ethernet link and data flow as well as modem carrier and data transmit/receive activity that occur via the electrical connections provided using an electrical connector plug 16 received by to a receptacle 18 in the rear portion of the card 10.

SUMMARY OF THE INVENTION

The present invention is directed to an improved status and/or activity light arrangement for use with a PC card. An illumination source, preferably an LED, is mounted on the PC card's printed circuit board and connected to appropriate electrical circuit elements thereon so as to be energized and thereby illuminated in response to electrical signals indicative of the status/activity of the card. A light pipe provides an optical coupling between the LED and at least one of the receptacles for receiving a standard RJ-xx type communications plug, for example, an RJ-11 or RJ-45 plug. The RJ-xx plug preferably includes an acrylic, translucent, e.g., transparent, body that transmits or conducts light from the receptacle end of the light pipe so as to become illuminated. So illuminated by the LED via the light pipe, the body of the RJ-xx plug thereby provides status and/or activity information. Multiple LEDs having different colors together with a corresponding number of light pipes may be provided.

A connection system in conformance with the present invention for providing electrical connections between an electronic device and an external system and visual indications of the status/activity of the device may comprise: (1) a detachable electrical connector plug having one or more electrical contacts within a translucent body, (2) a light source driven by the electronic device, the light source being illuminated to indicate a status of the electronic device, (3) a light pipe having first and second ends for directing illumination from its first end to its second end, the first end of the light pipe being proximate to the light source so as to be optically coupled thereto, (4) an electrical receptacle for providing one or more electrical signals from the electronic device to the detachable electrical connector plug when the connector plug is mated to the receptacle, and wherein the second end of the light pipe is coupled to the electrical receptacle to provide illumination from the light pipe to the translucent body of the electrical connector when the connector plug is mated to the receptacle.

In accordance with an alternative embodiment of the invention, the light pipe(s) may be eliminated and one or more light sources may be mounted directly within corresponding openings in a contact block associated with each receptacle.

In a further aspect of the present invention, the connectors and receptacles conform to standards for an RJ-11 or RJ-45 connector. In a still further aspect of the present invention, a plurality of light sources and light pipes are used to provide multiple indications of status or activity in the electronic device which drives the light sources. Still further, the light sources are preferably in the form of LEDs.

The novel features of the invention are set forth with particularity in the appended claims. The invention will be best understood from the following description when read in conjunction with the accompanying drawings.

DETAILED DESCRIPTION OF THE INVENTION

Figure 1:
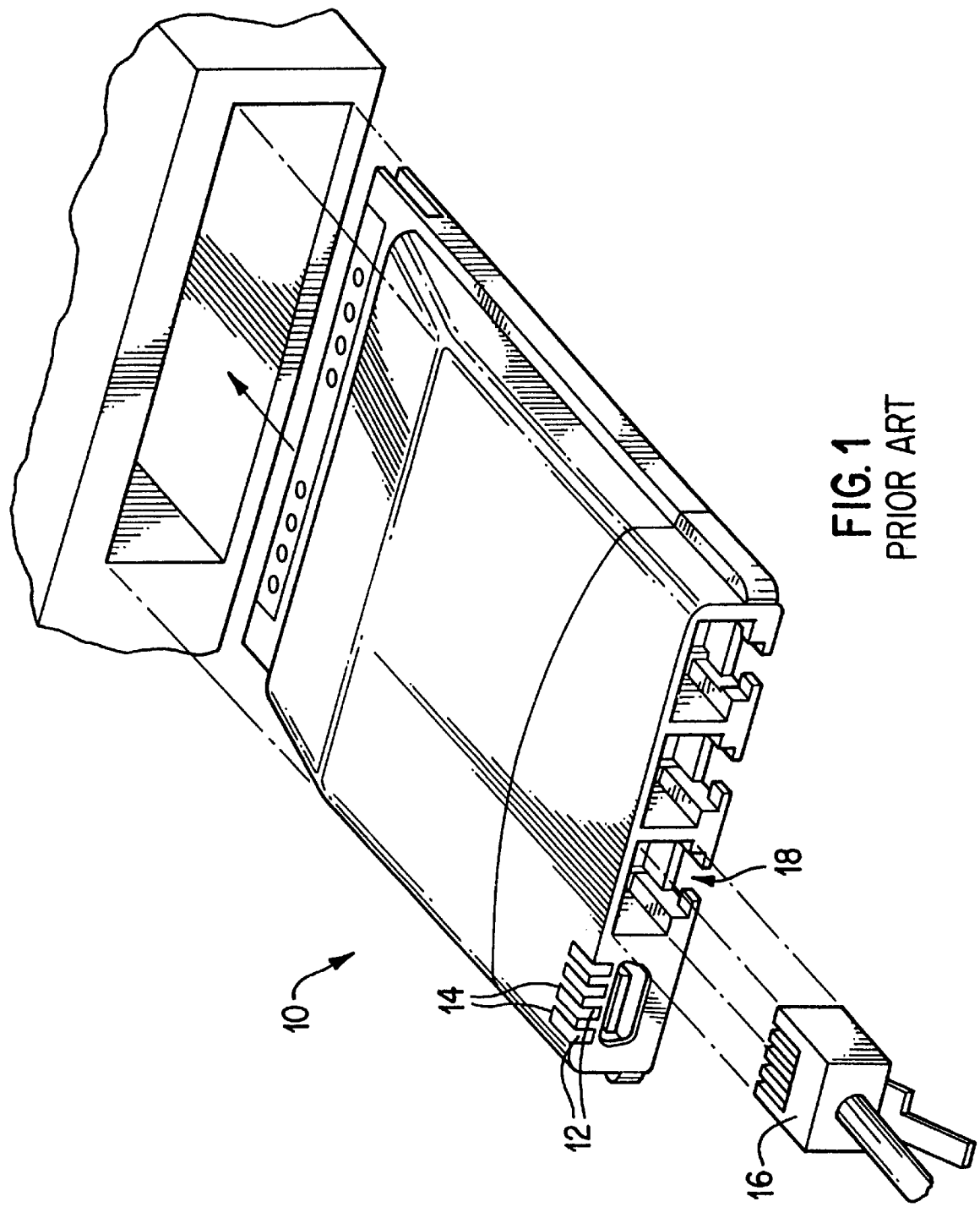
FIG. 1 is a perspective view of a prior art PCMCIA card having visual indicators mounted on the body of the PCMCIA card.
Figure 2:
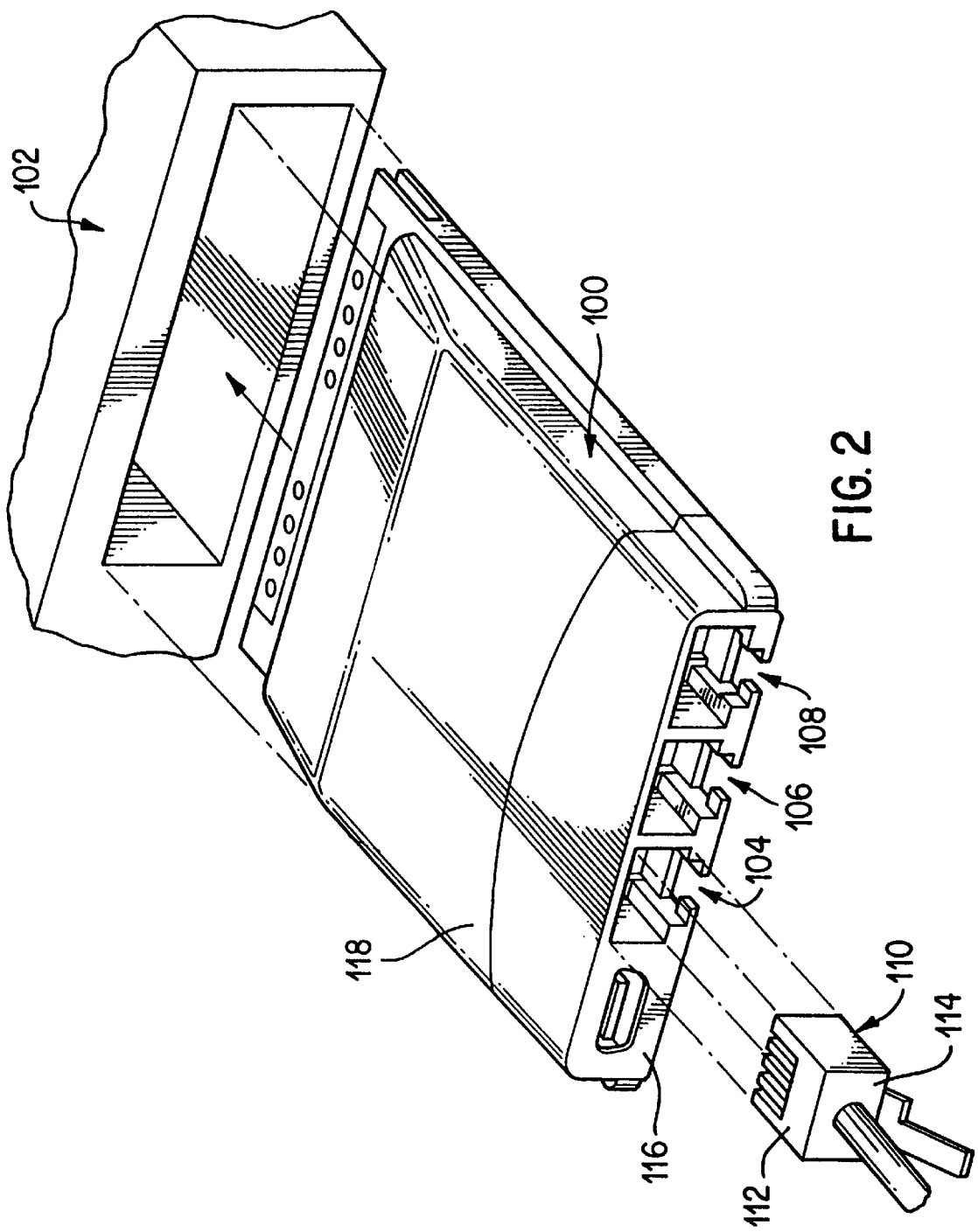
FIG. 2 is perspective view of a PCMCIA card incorporating an embodiment of the present invention by having illumination from status/activity indicators directed into its receptacles for viewing through the translucent body of a RJ-xx plug when inserted into the receptacle.

The present invention is directed to an improved status and/or activity light arrangement for use with an electronic device, e.g., a PCMCIA Type III PC card 100, that is plugged into a host system 102 (see FIG. 2). An illumination source, preferably an LED, is mounted on a printed circuit board within the housing of the PC card and connected to appropriate electrical circuit elements thereon so as to be energized and thereby illuminated in response to electrical signals indicative of the status/activity of the card. Preferably, a light guide, e.g., a light pipe, provides an optical coupling between the LED and at least one receptacle for receiving a standard RJ-xx type communications plug, for example, an RJ-11 or RJ-45 plug. FIG. 2 shows, by way of example, three receptacles 104, 106 and 108. The receptacle 104 may be configured to receive an RJ-11 plug 110 for connecting the card 100 to a telephone line; the receptacle 106 may be an RJ-11 receptacle for providing a telephone handset passthrough, and the receptacle 108 may be configured to receive an RJ-45 plug for connecting the card 100 to an Ethernet LAN. As is known, an RJ-xx plug typically includes an acrylic, translucent, e.g., transparent, body 112 and this property is used in the present invention to transmit or conduct light from the receptacle end of the light pipe to illuminate the body 112 for observation by the user. So illuminated by the LED via the light pipe, the body 112 of the RJ-xx plug 110 thereby provides status and/or activity information. Multiple LEDs having different colors together with a corresponding number of light pipes may be provided.

Figure 3:
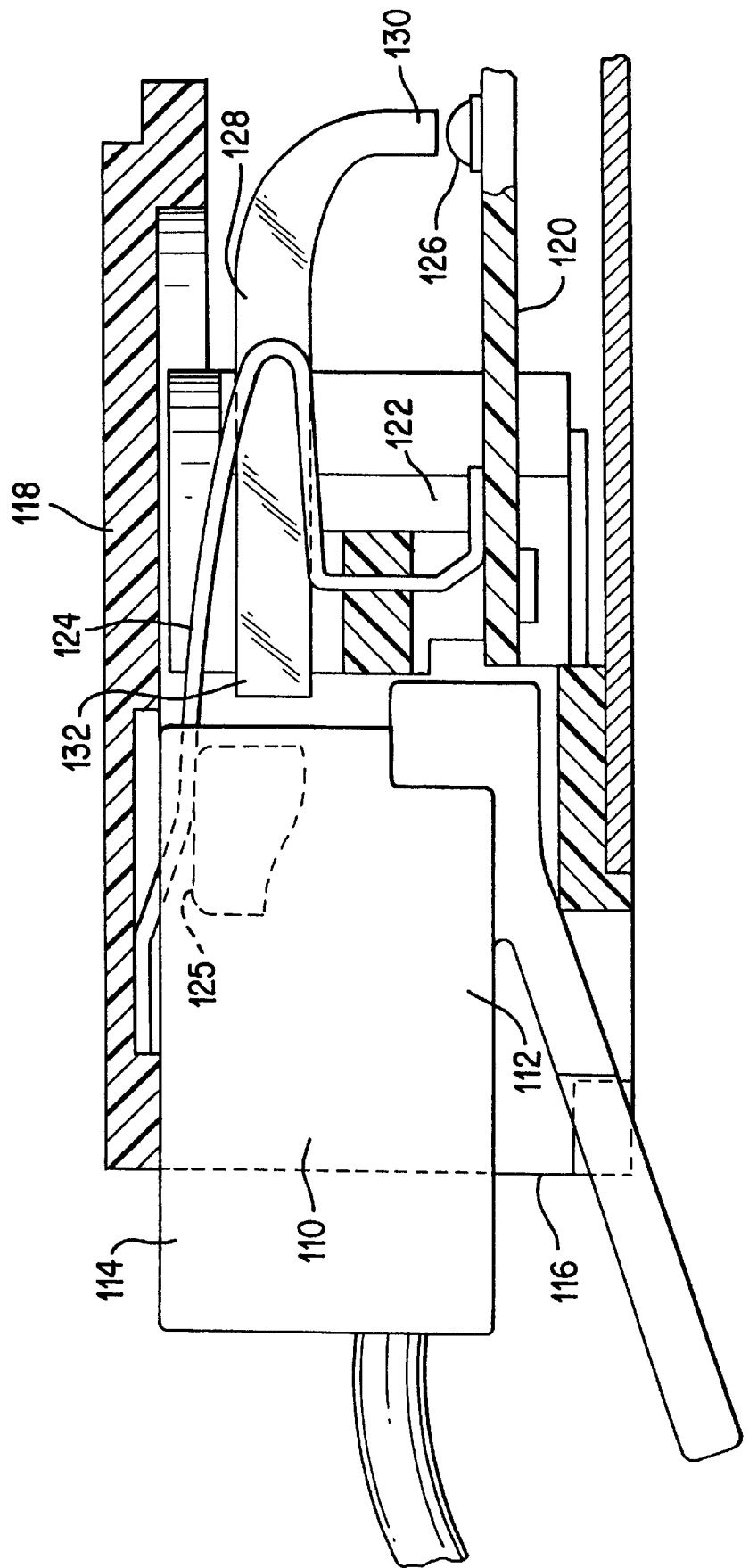
FIG. 3 is a cross sectional view of the rear portion of a Type III PCMCIA communications card which shows an exemplary embodiment of the invention.

FIG. 3 is a longitudinal cross section view of the rear portion of the Type III PCMCIA communications card of FIG. 2 and shows in greater detail an exemplary embodiment of the invention. The connector plug 110 is shown inserted in the receptacle 104. The rear portion 114 of the RJ-xx plug body 112 projects from the rear face 116 of the communication card housing 118. The card 100 encloses a printed circuit board 120 upon which is mounted a contact block 122 carrying a plurality of conductive wire contacts 124 for connecting circuitry on the printed circuit board 120 with a plurality of electrical terminals 125 of the RJ-xx plug 110. Mounted on the printed circuit board 120 is at least one illumination source 126, preferably an LED, electrically coupled to circuitry on the printed circuit board 120 so as to be energized and thereby illuminated in response to electrical signals indicative of the status and/or activity of the circuits on the printed circuit board 120. A light pipe 128 carried, for example, by the contact block 122 has a forward end 130 adjacent to the LED 126 and a rear end 132 projecting into the RJ-xx plug receptacle 104. The light pipe 128 may be made of any translucent or transparent light conducting or guiding material such as "LEXAN," a trademark of General Electric for a translucent polycarbonate. Light transmitted by the light pipe 128 from the LED 126 to the receptacle 104 is incident upon the RJ-xx plug body 112 thereby illuminating the plug body 112. Such illumination of the plug body 112 is observable by the card user and displays to the user the status and/or activity of the card 100.

Figure 4:
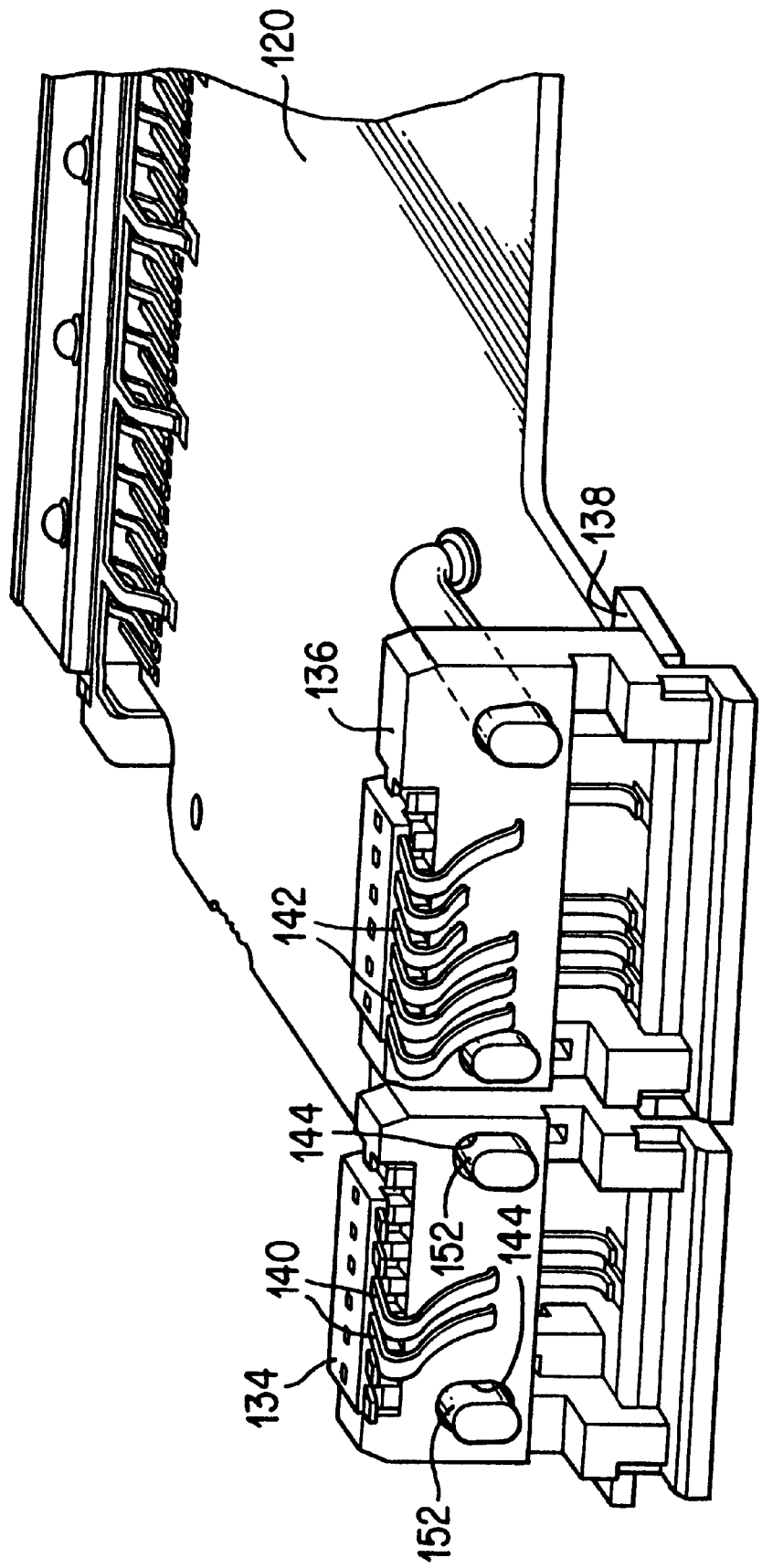
FIG. 4 is a perspective view of a pair of RJ-xx contact blocks, mounted on a rear edge of a printed circuit board, having illumination sources of the present invention incorporated therein.
Figure 5:
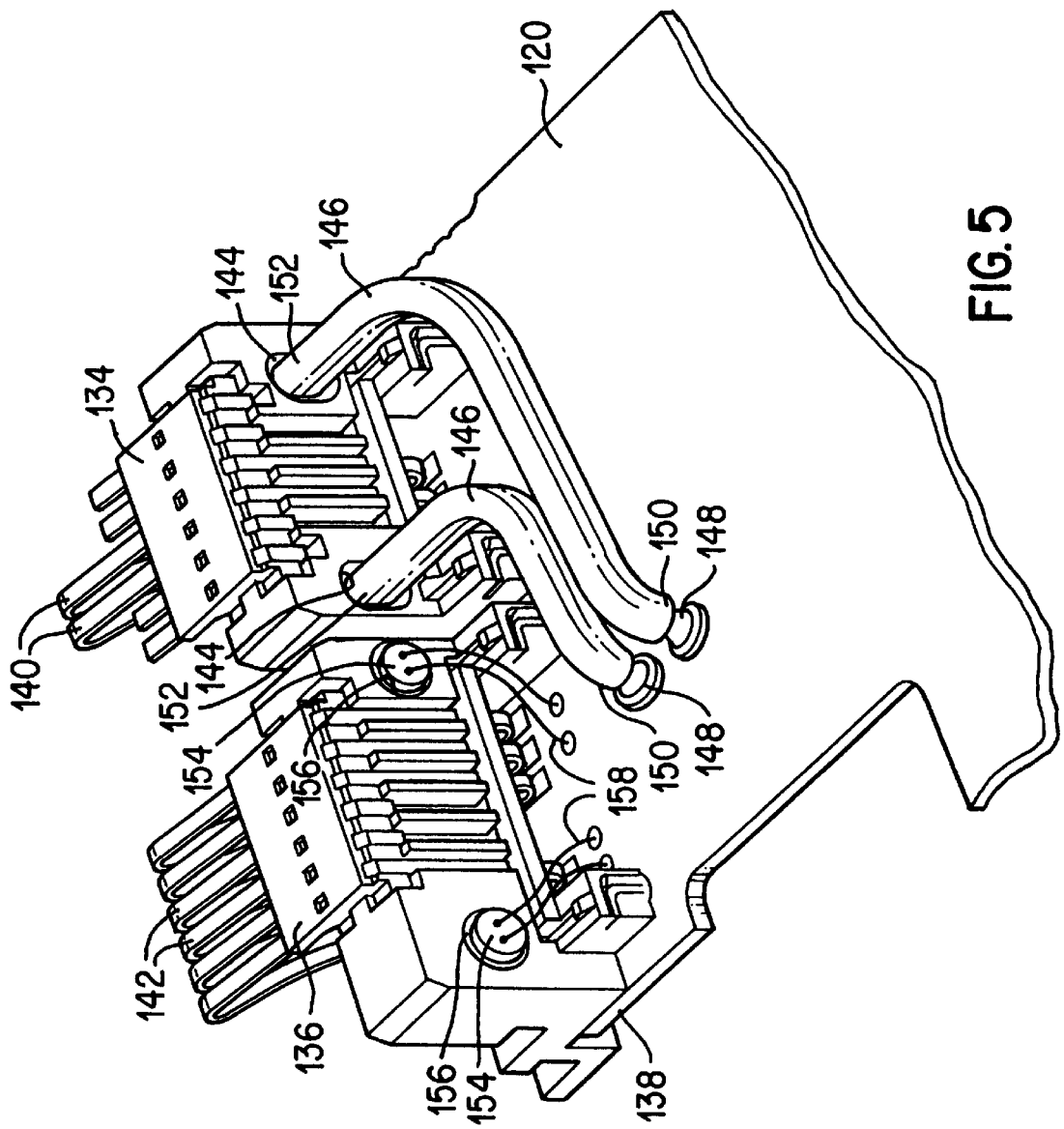
FIG. 5 is a perspective view of the front of the contact blocks of FIG. 4 which shows two alternative, exemplary couplings of the illumination sources to the receptacles.

FIGS. 4 and 5 show an RJ-11 contact block 134 along with an RJ-45 contact block 136 mounted on a rear margin 138 of the printed circuit board 120. Each contact block 134, 136 is associated with a receptacle in the manner illustrated in FIG. 3. Portions of the contact blocks 134 and 136, preferably at their peripheries and unobstructed by the contact wires 140, 142, define feed through holes 144 for accepting the second end of the light pipes. FIG. 5 is a rear view of the contact blocks 134 and 136 showing an example of how light pipes 146 can be used to direct illumination from printed circuit board mounted LEDs 148 to the receptacle associated with the contact block 134. Each light pipe 146 includes a first end 150 positioned proximate one of the LEDs 148 and a second end 152 projecting through a hole 144 in the contact block 143 into the associated connector plug receptacle. Optionally, a mating sleeve (not shown) may surround the first end 150 of the light pipe 146 and the LED 148 to enhance coupling of the light from the LED 148 to the light pipe 146. Accordingly, when circuitry on the printed circuit board 120 detects a particular status/activity condition, e.g., Ethernet link and data flow or modem carrier and data transmit/receive activity, the LED 148 associated with this status can be driven and this will be visually provided through the light pipe 146 into the translucent body 112 of the connector plug 110.

Preferably, multiple illumination sources 148 are used to provide status/activity indications at each connector plug. Furthermore, it is preferable that different color illumination sources be used to indicate different status/activity information. This task can be accomplished with discrete LED devices that illuminate with different colors. Alternatively, individual LED devices are known that can be driven differently, e.g., in polarity, to generate different colors and thus indicate a different status. Still further, it will be evident that besides different colors, the LEDs can be operated steady state or in a pulse mode to provide still further status indications.

As shown in FIG. 5, of the two contact blocks 134 and 136, only one block 134 has light pipes associated with it. Alternatively, it will be evident that each of the two contact blocks 134 and 136 may carry one or more light pipes for illuminating an RJ-xx type plug inserted in the associated receptacle.

FIG. 5 illustrates an alternative embodiment of the invention eliminating the need for light pipes. Thus, in FIG. 5 contact block 136 carries at least one and preferably two LEDs 154 each mounted in a through hole 156 formed in the block 136. Each LED 154 includes leads 158 coupled to traces on the circuit board 120. Thus, each LED 154 operates to directly illuminate an RJ-type connector plug inserted in the associated receptacle in response to status/activity signals generated by the PCB circuitry.

Although the present invention has been described in detail with reference only to the presently-preferred embodiments, those of ordinary skill in the art will appreciate that various modifications can be made without departing from the invention. For example, while the description has been directed toward the use of the invention on a PCMCIA card using LEDs as light sources, the use of other types of light sources are also considered to be within the scope of the present invention. Accordingly, the invention is limited only by the scope of the following claims.

We claim:

1. A visual indicator for indicating the status of an electronic device in a detachable translucent electrical connector plug, said indicator comprising:

a light source driven by said electronic device, said light source being illuminated to indicate a status of said electronic device;

a light pipe having first and second ends for directing illumination from its first end to its second end, said light pipe optically coupled at its first end to said light source;

an electrical receptacle having an interior for receiving said connector plug and for providing one or more electrical signals from said electronic device to the connector plug when the connector plug is mated to said receptacle; and wherein said second end of said light pipe is disposed to illuminate said interior of said electrical receptacle to provide illumination from said light pipe to said translucent electrical connector plug when the connector plug is mated to said receptacle.

2. The visual indicator of claim 1 wherein said light source is a light emitting diode.

3. The visual indicator of claim 1 wherein said light pipe is comprised of a light conducting plastic.

4. The visual indicator of claim 1 wherein said receptacle is configured to accept an RJ-45 connector plug.

5. The visual indicator of claim 1 wherein said receptacle is configured to accept an RJ-11 connector plug.

6. The visual indicator of claim 1 wherein said electronic device is a PCMCIA type card.

7. The visual indicator of claim 1 wherein said second end of said light pipe projects into said interior of said receptacle.

8. The visual indicator of claim 1 comprising at least two light sources and at least two light pipes for providing at least two status indicators.

9. The visual indicator of claim 8 wherein at least one of said light sources emits illumination of a different color to indicate a different status of said electronic device.

10. The visual indicator of claim 8 wherein at least one of said light sources emits illumination of a different color from another one of said illumination sources.

11. A system for providing electrical connections to an electronic device and visual indications of the status or activity of said device, said system comprising:

a detachable electrical connector plug having one or more electrical contacts within a translucent body;

a light source driven by said electronic device, said light source being illuminated to indicate a status or activity of said electronic device;

a light pipe having first and second ends, said light pipe directing illumination from its first end to its second end, the first end of said light pipe being optically coupled to said light source;

an electrical receptacle having an interior for receiving said translucent body of said detachable electrical connector plug, said electrical receptacle providing one or more electrical signals between said electronic device and the detachable electrical connector plug when said connector plug body is in place in said interior of said receptacle; and wherein said second end of said light pipe is optically coupled to said interior of said electrical receptacle to provide illumination from said light pipe to said translucent body of said electrical connector plug when said connector plug is in place in said interior of said receptacle.

12. The system of claim 11 wherein said light source is a light emitting diode.

13. The system of claim 11 wherein said light pipe is comprised of a light conducting plastic.

14. The system of claim 11 wherein said receptacle is configured to accept an RJ-45 connector plug.

15. The system of claim 11 wherein said receptacle is configured to accept an RJ-11 connector plug.

16. The system of claim 11 wherein said electronic device is a PCMCIA type card.

17. The system of claim 11 wherein said second end of said light pipe projects into said interior of said electrical receptacle.

18. The system of claim 11 comprising two or more light sources and two or more light pipes for providing a plurality of status indicators.

19. The system of claim 18 wherein at least one of said light sources emits illumination of a different color to indicate a different status of said electronic device.

20. The system of claim 18 wherein at least one of said light sources emits illumination of a different color from another one of said light sources.

21. A PCMCIA communications card, adapted to be connected to a translucent RJ-type communications plug having at least one contact, the PCMCIA communications card including:

a receptacle portion having an interior configured to detachably receive part of the translucent RJ-type plug, the plug-receiving receptacle portion including at least one contact wire adapted to engage the at least one contact on the RJ-type plug when the plug is in place within said receptacle portion interior;

a light source carried by the card, the light source being energizeable in response to a status condition of the communications card; and a plastic light pipe optically coupling the light source with the interior of the receptacle portion to illuminate the translucent RJ-type plug when the plug is in place in the interior of the receptacle portion.

22. The PCMCIA card of claim 21 wherein the plastic light pipe has a first end adjacent to the light source and a second end projecting into the interior of the receptacle portion.

23. The PCMCIA card of claim 21 wherein the light source comprises a light emitting diode.

* * * * *